United States Patent
Brunolli et al.

(10) Patent No.: US 9,083,330 B2
(45) Date of Patent: Jul. 14, 2015

(54) OUTPUT DRIVER WITH SLEW RATE CALIBRATION

(71) Applicant: QUALCOMM Incorporated, San Diego, CA (US)

(72) Inventors: Michael Joseph Brunolli, Escondido, CA (US); Mark Wayland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/056,904

(22) Filed: Oct. 17, 2013

(65) Prior Publication Data

US 2015/0109023 A1    Apr. 23, 2015

(51) Int. Cl.
  *H03K 19/003*    (2006.01)
  *H03K 19/00*     (2006.01)
  *H03K 19/0175*   (2006.01)
  *H04L 25/02*     (2006.01)

(52) U.S. Cl.
  CPC .... *H03K 19/0005* (2013.01); *H03K 19/017545* (2013.01); *H04L 25/0278* (2013.01)

(58) Field of Classification Search
  CPC .. G11C 7/1051; G11C 27/024; H03K 17/164; H03K 17/167; H03K 19/0005; H03K 19/00315; H03K 19/00361; H03K 19/00384; H03K 19/01714; H03K 19/017509; H03K 19/017545; H03K 19/084; H03K 19/09448; H04L 25/0272; H04L 25/0278
  See application file for complete search history.

(56) References Cited

U.S. PATENT DOCUMENTS

| | | | |
|---|---|---|---|
| 5,877,647 A | 3/1999 | Vajapey et al. | |
| 6,294,924 B1 | 9/2001 | Ang et al. | |
| 6,356,102 B1 * | 3/2002 | Klein et al. | 326/27 |
| 6,466,487 B1 * | 10/2002 | Otsuka | 365/189.05 |
| 6,664,805 B2 | 12/2003 | Gonzalez | |
| 6,894,543 B2 * | 5/2005 | Ho et al. | 327/108 |
| 6,906,567 B2 | 6/2005 | Culler | |
| 7,295,042 B2 * | 11/2007 | Hatanaka | 326/87 |
| 7,362,127 B2 * | 4/2008 | Tokuhiro et al. | 326/30 |
| 7,443,203 B2 * | 10/2008 | Oguri | 326/83 |
| 7,573,288 B2 * | 8/2009 | Ayyapureddi et al. | 326/30 |
| 7,573,298 B2 * | 8/2009 | Sawada et al. | 326/82 |
| 7,595,656 B2 * | 9/2009 | Hayami et al. | 326/30 |
| 7,821,289 B2 | 10/2010 | Lee et al. | |
| 8,040,150 B2 * | 10/2011 | Nakatsu | 326/30 |
| 8,334,715 B1 | 12/2012 | Muthali et al. | |
| 2008/0106297 A1 | 5/2008 | Jao | |
| 2014/0285231 A1 * | 9/2014 | Suematsu et al. | 326/30 |

OTHER PUBLICATIONS

International Search Report and Written Opinion—PCT/US2014/060378—ISA/EPO—Dec. 19, 2014.

* cited by examiner

*Primary Examiner* — Alexander H Taningco
*Assistant Examiner* — Kurtis R Bahr
(74) *Attorney, Agent, or Firm* — Haynes and Boone, LLP

(57) ABSTRACT

An output driver for driving a data output signal through an output pad includes a plurality of calibration paths to calibrate the impedance of the output pad. Depending upon the desired impedance, various ones of the calibration paths are selectively coupled to the output pad. Each selected calibration path adds a capacitive load to a data node, which affects the slew rate for the data output signal. To adjust the capacitive load on the data node in light of the calibration path selections, the output driver includes a plurality of selectable capacitors corresponding to the plurality of calibration paths. If a calibration path is not selected to couple to the output pad, the corresponding selectable capacitor capacitively loads the data node.

7 Claims, 5 Drawing Sheets

OUTPUT DRIVER WITH SLEW RATE CALIBRATION

TECHNICAL FIELD

This application relates to output drivers, and more particularly to output drivers configured to adjust capacitive loading responsive to an impedance calibration.

BACKGROUND

If an output driver for an integrated circuit has an output impedance that is mismatched to the characteristic impedance of the traces and interconnects that couple the integrated circuit to external devices, undesirable effects may occur such as jitter and signal reflections. Thus, it is conventional for an integrated circuit output driver to have some configurability so that it may be calibrated to the desired output impedance. To achieve this calibration, a conventional driver includes a pull-down section as well as a pull-up section for driving a data output signal. When such an output driver asserts the data output signal high, the pull-up section pulls the driver's output pad to a power supply voltage VDD. Conversely, when the output driver drives the data output signal low, the pull-down section discharges the driver's output pad to ground (VSS). Each section includes a plurality of legs, with a subset of the legs each including a calibration transistor. A calibration word for each section comprising a plurality of calibration bits controls the section's calibration transistors. The assertion of a calibration bit in the calibration word for the pull-down section causes the corresponding calibration transistor to switch on and conduct current from the output pad to VSS. Conversely, the assertion of a calibration bit in the calibration word for the pull-up section causes the corresponding calibration transistor to switch on and conduct charge from a power supply node to the output pad to charge its voltage to VDD. Since each leg has a corresponding resistor, the driving of current through the selected calibration transistors adjusts the output impedance.

Although the calibration transistors assist in the impedance matching, they also complicate the loading of the data output signal in the pull-up and pull-down sections. For example, FIG. 1 illustrates a conventional pull-down section 105 for an output driver 100. Pull-down section 105 functions to discharge an output pad 110 to ground in response to the assertion of a complement data output signal (nd). Conversely, the pull-up section (not illustrated) functions to charge output pad 110 to a power supply voltage VDD in response to the assertion of the data output signal.

A default leg in pull-down section 105 discharges output pad 110 to ground (VSS) through a resistor R in response to an NMOS data transistor M1 switching on when the complement data output signal nd is asserted. Each selectable leg also includes an NMOS data transistor M1 that conducts responsive to the assertion of the complement data output signal nd. But each selectable leg also includes an NMOS calibration transistor that will conduct only when the corresponding calibration bit is asserted. For example, a selectable leg 0 includes an NMOS calibration transistor M2 having a gate coupled through a transmission gate T1 to the complement data output signal nd. A calibration bit C0 controls transmission gate T1 so that transmission gate T1 closes when calibration bit C0 is asserted and opens when calibration bit C0 is de-asserted. Thus, in response to an assertion of both calibration bit C0 and the complement data output signal nd, selectable leg 0 discharges output pad 110 to ground through a resistor $R_1$. Selectable leg 1 includes an NMOS calibration transistor M3 that discharges output pad 110 to ground through a resistor $R_2$ in response to the assertion of the complement data output signal nd and a calibration bit C1 closing a transmission gate T2.

Before the manufacture in a foundry, one does not know the process corner for the resulting semiconductor substrate in which driver 100 is integrated. If driver 100 were manufactured with a fast process corner, transistor M1 in the default leg may function to sink sufficient current such that none of the calibration bits need be asserted. In other words, a fast corner output driver 100 may provide the desired output impedance without using any of the selectable legs. But at slower process corners, more and more of the selectable legs become necessary to produce the desired output impedance. At each slower process corner, one or more of the selectable legs are turned on through their assertion of their corresponding calibration bit. But notice the problem—the complement data output signal nd is subjected to more of a capacitive load through the various closed transmission gates at these slower process corners. In contrast, the complement data output signal nd is not loaded at the fast process corners. This is the converse of what is desired since the slower slew rates at the slower process corners are slowed down even more by the extra capacitive loading in the selectable legs.

Accordingly, there is a need in the art for impedance-calibrated output drivers with enhanced slew rate control.

SUMMARY

An output driver for driving a data output signal through an output pad includes a plurality of calibration paths for calibrating an impedance of the output pad. The calibration paths are configured to selectively respond to an impedance calibration word such that selected ones of the calibration paths are conductive and any remaining non-selected ones of the calibration paths are non-conductive. Each conducting calibration paths capacitively loads a data node in the output driver. Thus, if the impedance calibration word is such that it selects for relatively few or none of the calibration paths, the data node has relatively little or no capacitive loading from the impedance calibration. To prevent excessive slew rates from each non-conducting calibration path, the output driver includes a plurality of selectable capacitors corresponding to the plurality of calibration paths. Each selectable capacitor is configured to capacitively load the data node if the corresponding calibration path is non-conductive. In this fashion, the capacitive loading is stabilized across the various impedance calibration settings.

DETAILED DESCRIPTION

Figure 1:
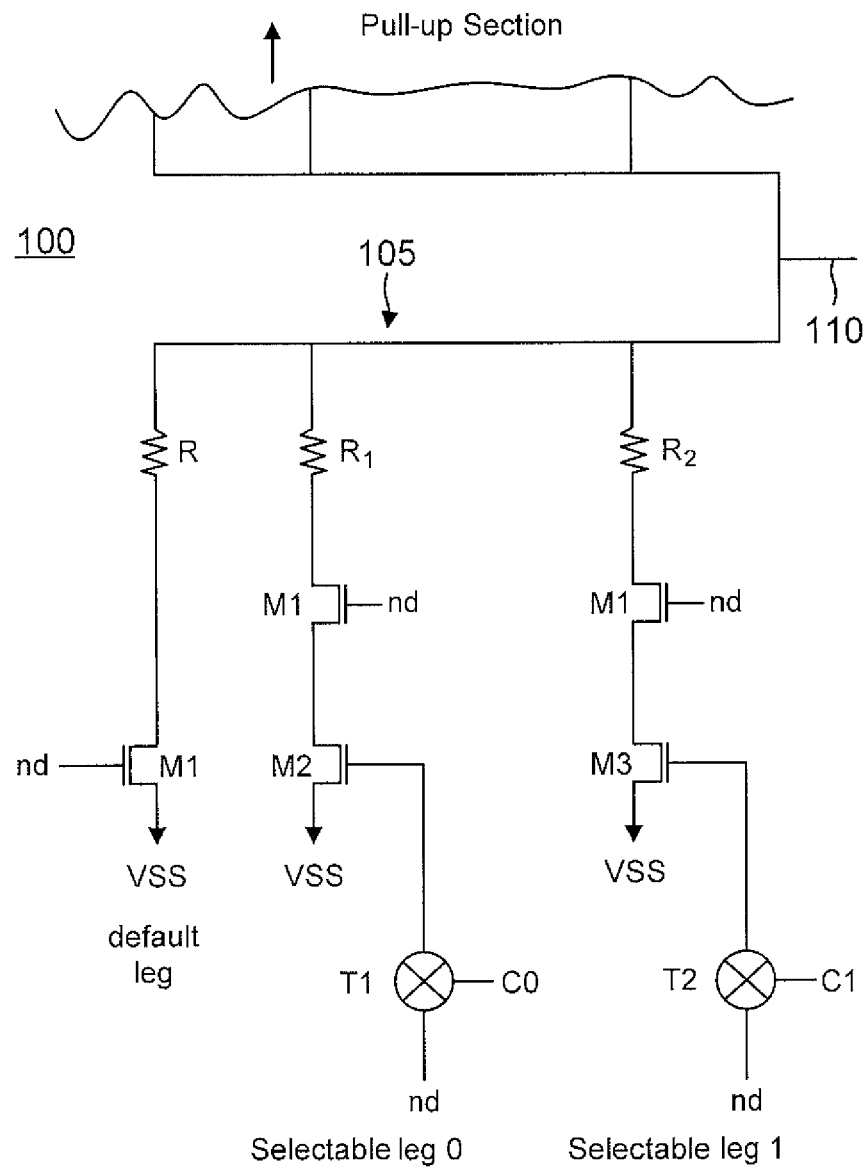
FIG. 1 is a schematic diagram of a pull-down section for a conventional calibrated output driver.

A calibrated output driver with slew rate control is provided that includes a plurality of calibration paths that may be selected to conduct so that the output driver drives a data output signal through an output pad at the desired impedance. For example, in one calibration setting, the output driver may drive the output pad without any of the calibration paths conducting. Alternatively, the output driver may be calibrated so as to drive the output pad in which a subset or all of the calibration paths are conducting. The output driver includes a pull-up section and a pull-down section each having a corresponding plurality of calibration paths. The pull-up and pull-down sections are configured to respond to respective impedance calibration words to select for the conducting calibration paths. Each impedance calibration word comprises a plurality of calibration bits corresponding to the plurality of calibration paths in the corresponding pull-up or pull-down section such that each calibration path is controlled by a corresponding calibration bit. Each calibration path is configured to conduct responsive to an assertion of its corresponding calibration bit.

The output driver responds to a data output signal to drive the output pad accordingly. In that regard, since the data output signal is binary, it is arbitrary to indicate that the output driver responds to the data output signal or its complement. For example, as the data output signal is asserted high, the output driver should drive the output pad high. But it is equivalent for the output driver to drive the output pad high in response to the complement data output signal being de-asserted (pulled low to ground). Thus, the following discussion will assume that the output driver responds to the complement data output signal without loss of generality. As more and more calibration paths are selected to conduct in a pull-down section or pull-up section, the additional selected calibration paths increase a capacitive load on an output driver data node carrying the complement data output signal. As discussed above, this has the undesirable effect of lowering the already-relatively-slow slew rates at the slower process corners. It is at these process corners that more and more calibration paths are selected to conduct.

The output driver disclosed herein advantageously includes a plurality of selectable capacitors corresponding to the plurality of calibration paths in each of the pull-up and pull-down sections. If a calibration path is not selected to conduct, the corresponding selectable capacitor loads the output driver data node with its capacitance. Conversely, if a calibration path is selected, the corresponding selectable capacitor does not load the output driver data node. Since a calibration path is selected through its calibration bit, the corresponding selectable capacitor is selected by the complement of the calibration bit. The resulting selective addition of a capacitive load on the output driver data node from the selectable capacitors is quite advantageous in that the data node's capacitive load from the selected capacitors is inversely proportional to the capacitive loading on the data node from the selected calibration paths. In this fashion, the capacitive loading is stabilized for the various process corners to optimize the slew rate. For example, at a fast process corner in which most or all of the calibration paths are inactive (non-conducting), the corresponding selectable capacitors for the inactive calibration paths load the output driver data node. At a slower process corner in which some or all of the calibration paths are conducting, the corresponding selectable capacitors for the conducting calibration paths do not load the output driver node.

The disclosed concepts and features are widely applicable to any output driver that calibrates its output impedance through the selection of calibration paths. As used herein, a calibration path is any current path in the output driver that selectively couples to an output pad to achieve a desired impedance by charging (in the pull-up section) or discharging (in the pull-down section) the output pad through a resistor for the calibration path. As more and more calibration paths are selected, the output impedance for the output driver is changed accordingly. The following discussion will focus on two output driver architectures. In a first architecture, the output driver includes at least one default leg and a plurality of selectable legs. Each selectable calibration leg comprises a calibration path. The default leg conducts regardless of the calibration bit settings whereas the calibration legs conduct responsive to the calibration bit assertions. In a second architecture, the output driver includes a plurality of dual-mode legs, where each dual-mode leg includes a calibration path as well as a data path. Like the default leg, the data paths all conduct regardless of the calibration bit settings. The calibration paths conduct responsive to the assertion of their calibration bits. But it will be understood that these two architecture are merely representative in that the concepts and features disclosed herein are broadly applicable to any output driver architecture with calibration paths. These concepts and features may be better appreciated by the following discussion of example embodiments.

Example Embodiments

Figure 2:
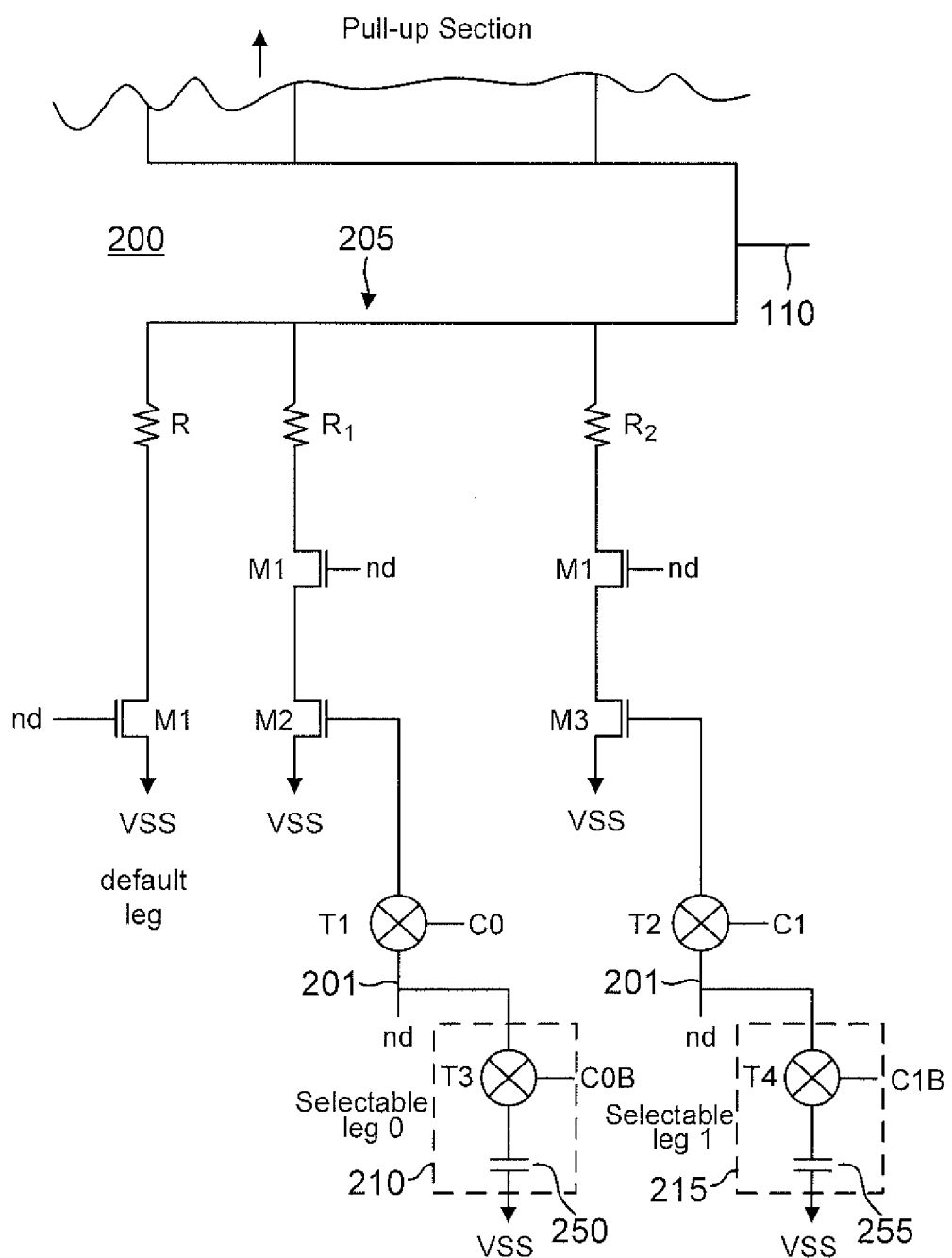
FIG. 2 is a schematic diagram of a pull-down section for an impedance-calibrated output driver with slew rate control in accordance with a first embodiment of the disclosure.

An example driver 200 having the first architecture is shown in FIG. 2. Analogous to driver 100, driver 200 includes a pull-down section 205 and a pull-up section (not illustrated), each containing a plurality of calibration paths. The following discussion will focus on pull-down section 205 but it will be appreciated that the pull-up section operates analogously except that the legs in the pull-up section selectively form conductive paths from the output pad to a power supply node instead of VSS.

Pull-down section 205 includes a default leg that operates as discussed with regard to conventional driver 100. There are two selectable legs (leg 0 and leg 1), each comprising a calibration path. The pull-up section may have the same number of calibration paths. To distinguish between the plurality of calibration paths in pull-down section 205 and the corresponding plurality of calibration paths in the pull-up section, one plurality may be denoted as comprising first calibration paths and the other as comprising second calibration paths. The number of selectable legs (and thus the number of calibration paths) in alternative embodiments may be larger than the two used in driver 200. Indeed, the number of selectable legs depends upon the impedance adjustment range and the precision desired with regard to achieving a desired impedance within that range. For example, the use of four selectable legs leads to four bits of resolution within the desired impedance range (sixteen different impedances depending upon the selection of the selectable legs). Similarly, an output driver with five selectable legs in each of the pull-down and pull-up sections provides five bits of resolution (thirty-two different settings depending upon the selection of the five selectable legs).

Each selectable leg is configured to couple output pad 110 to ground when its corresponding calibration bit is asserted in conjunction with the assertion of the complement data output signal nd. The selectable legs receive the complement data output signal nd through transmission gates T1 and T2 that operate as discussed with regard to conventional driver 100. Transmission gates T1 and T2 may thus be denoted as first transmission gates to distinguish them from a set of second transmission gates T3 and T4 discussed further below that function to adjust the slew rate. Selectable leg 0 includes first transmission gate T1 that closes in response to an assertion of calibration bit C0 to allow the complement data output signal nd to drive the gate of an NMOS calibration transistor M2. If both the complement data output signal nd and the calibration bit C0 are asserted, selectable leg 1 discharges output pad 110 to ground through resistor $R_1$ as its data transistor M1 and calibration transistor M2 will both be switched on. Similarly, leg 1 includes first transmission gate T2 that conducts in response to a calibration bit C1 to allow complement data output signal nd to drive the gate of a calibration transistor M3 to discharge output pad 110 to ground through resistor $R_2$.

The selection of a given selectable leg (and thus the selection of a calibration path) to conduct through the assertion of the corresponding calibration bit adds a capacitive load to a data node 201 carrying the complement data output signal nd because the complement data output signal nd must drive the gates of the calibration transistors in the selected calibration paths. But note that it is the slower process corners that require the most selected calibration paths. The faster process corners would require fewer (or no) asserted calibration bits and thus would have fewer or no selected selectable legs. This is undesirable in that the faster process corners would have the least capacitive load whereas the slower process corners would have a greater capacitive load. To address this capacitive loading imbalance and thus stabilize the data output signal slew rates across all process corners, output driver 200 includes a plurality of selectable capacitors corresponding to the plurality of calibration paths. A selectable capacitor 210 corresponds to selectable leg 0 whereas a selectable capacitor 215 corresponds to selectable leg 1. Each selectable capacitor is configured to capacitively load data node 201 when the corresponding selectable leg is inactive (non-conducting). For example, each selectable capacitor may comprise a capacitor and a second transmission gate. In selectable capacitor 210, a second transmission gate T3 couples data node 201 to ground through a capacitor 250 in response to the assertion of a complement of the calibration bit C0 (C0B). In other words, if calibration bit C0 is false such that selectable leg 0 is not conducting, then transmission gate T3 is conducting because C0B is true (asserted) so that capacitor 250 loads data node 201. Similarly, a second transmission gate T4 in selectable capacitor 215 couples data node 201 to ground through a capacitor 255 in response to the assertion of a complement of calibration bit C1 (C1B). Thus, if calibration bit C1 is false such that selectable leg 1 is not conducting, then second transmission gate T4 is conducting in response to C1B being asserted.

Note the complementary behavior of second transmission gates T3 and T4 to first transmission gates T1 and T2, respectively. For example, if selectable leg 0 is conducting to ground while first transmission gate T1 is closed, then the corresponding second transmission gate T3 is turned off. Conversely, if selectable leg 0 is non-conducting such that first transmission gate T1 is open, then the corresponding second transmission gate T3 is closed. This is quite advantageous in that the slew rate at the fast process corners is prevented from being excessive. For example, suppose the process corner is sufficiently fast such that that neither selectable leg is selected to conduct. Capacitors 250 and 255 will then load data node 201 through second transmission gates T3 and T4 being switched on accordingly.

Figure 3:
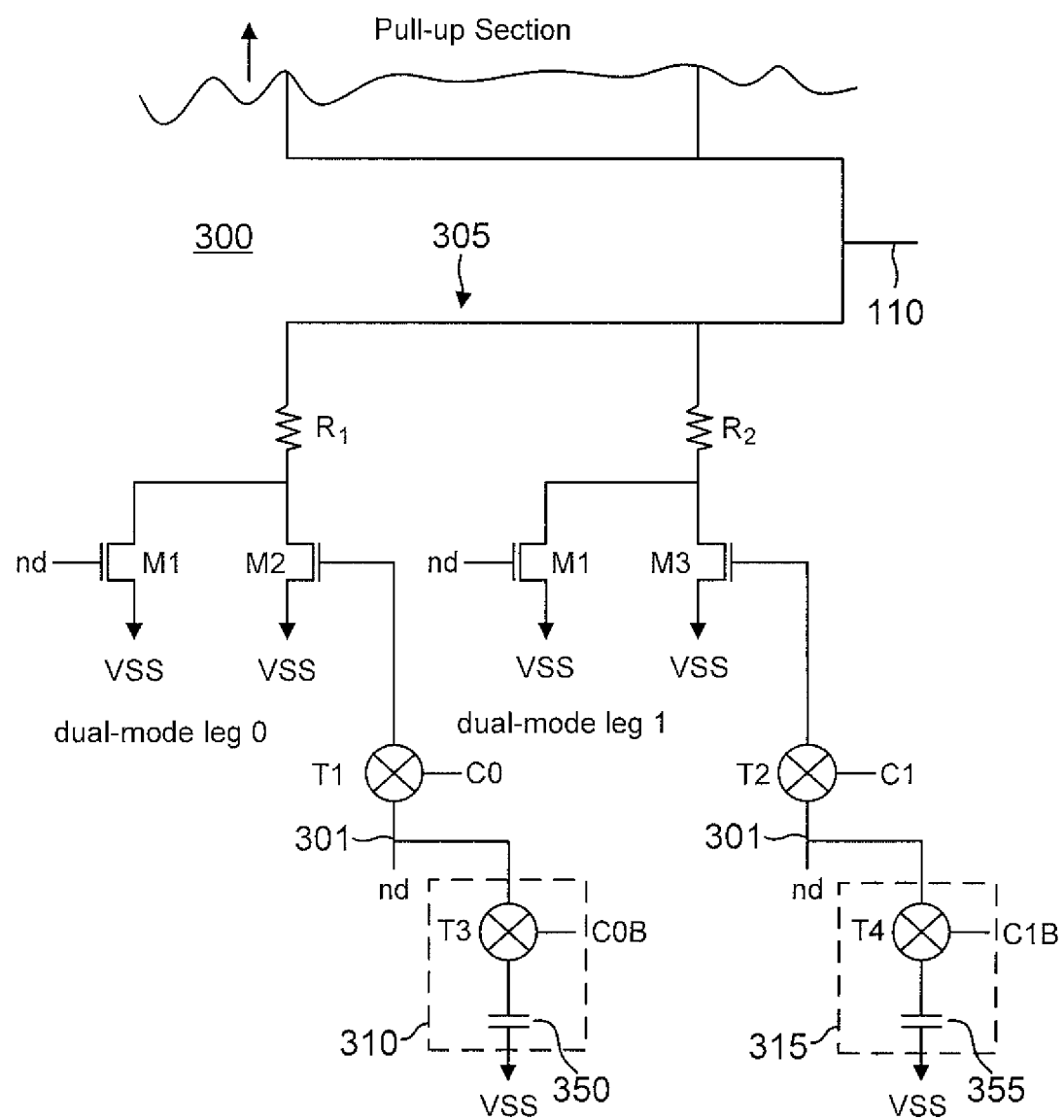
FIG. 3 is a schematic diagram of a pull-down section for an impedance-calibrated output driver with slew rate control in accordance with a second embodiment of the disclosure.

An embodiment for the second output driver architecture is shown in FIG. 3 for a driver 300 having a pull-down section 305. In this embodiment, there is no default leg but only two dual-mode legs: a dual-mode leg 0 and a dual-mode leg 1. It will be appreciated that only two such legs are shown for illustration purposes in that the number of dual-mode legs depends upon the number of sampling steps within a desired impedance range for the output impedance at output pad 110. Each dual-mode leg includes a data path comprising an NMOS data transistor M1 whose gate is controlled by the complement data output signal nd. In addition, each dual-mode leg includes a calibration path comprising a calibration transistor whose gate is controlled by a corresponding calibration bit. For example, the calibration path in dual-mode leg 0 comprises an NMOS calibration transistor M2 whose gate is driven by complement data output signal nd when a first transmission gate T1 closes in response to the assertion of a calibration bit C0. The calibration bits for pull-down section 305 are controlled so that they are only asserted while complement output data signal nd is asserted. Alternatively, each calibration path may include a data transistor in series with the corresponding calibration transistor analogous to the calibration paths in pull-down section 205.

The calibration path in dual-mode leg 1 comprises an NMOS calibration transistor M3 whose gate is driven by complement data output signal nd when a first transmission gate T2 closes in response to the assertion of a calibration bit C1. Each dual-mode leg thus has a first mode of operation in which only its data path is conducting in response to the assertion of the complement data signal nd. In addition, each dual-mode leg has a second mode of operation in which both its data path and its calibration paths are conducting in response to the assertion of both the complement data signal nd and the corresponding calibration bit. Each dual-mode leg includes a resistor having a first terminal coupled to output pad 110 and an opposing second terminal coupled to the dual-mode leg's data transistor and calibration transistor. For example, dual-mode leg 0 includes a resistor $R_1$ coupled to a drain for data transistor M1 and calibration transistor M2. Dual-mode leg 1 includes an analogous resistor $R_2$.

As discussed analogously with regard to pull-down section 205, pull-down section 305 includes a selectable capacitor for each dual-mode leg. A selectable capacitor 310 corresponds to dual-mode leg 0 whereas a selectable capacitor 315 corresponds to dual-mode leg 1. A data node 301 carrying the complement data output signal nd is capacitively loaded by selectable capacitors 310 and 315, respectively, when the calibration paths in these legs are not selected to conduct (corresponding to the first mode of operation for each dual-mode leg). For example, a second transmission gate T3 in selectable capacitor 310 closes in response to an assertion of a complement of calibration bit C0 (designated as C0B) to couple data node 301 to ground through a capacitor 350 when dual-mode leg 0 is in the first mode of operation. Similarly, a second transmission gate T4 in selectable capacitor 315 closes in response to an assertion of a complement of calibration bit C1 (designated as C1B) to couple data node 301 to ground through a capacitor 355 when dual-mode leg 2 is in the first mode of operation. Thus, if a dual-mode leg's calibration path is not selected to conduct, the corresponding complement calibration bit is asserted so that the corresponding selectable capacitor loads data node 301 with its capacitance. In this fashion, the advantageous slew rate control discussed with regard to driver 200 is achieved by driver 300. When a dual-mode leg is in the second mode of operation (both the data path and calibration path being conductive), the corresponding selectable capacitor does not load data node 301.

Pull-down section 305 has a number of advantages as compared to pull-down section 205. For example, the transistors in each dual-mode leg may be sized according to the desired current for the dual-mode leg. In that regard, suppose a generic pull-down section must sink a current I from its output pad to provide the desired output impedance. The default leg in in pull-down section 205 must then be robust enough to conduct all of current I for a sufficiently fast process corner. None of the selectable legs would be conducting at such a process corner. Thus, the resistor R in the default leg as well as data transistor M1 must be relatively large to handle the full amount of current I. In contrast, the data path in each dual-mode leg in pull-down section 305 are always conducting such that no one leg needs to accommodate the full amount of current I in any process corner scenario. All the corresponding resistors for the dual-mode legs are thus used regardless of the process corner. In contrast, the resistors corresponding to the selectable legs in pull-down section 205 may never be used at the faster process corners, which is wasteful and leads to low density. In contrast, the resistors and transistors for the dual-mode legs may thus be relatively small as they must not support so much current. Not only do the dual-mode legs thus provide greater density, the spreading of the desired current I across all the dual-mode legs also reduces the issue of electromigration, which thus increases longevity and reliability.

The relative resistor and transistor sizes in the dual-mode legs depend upon the calibration scheme. For example, if the resistances are binary weighted, the corresponding desired currents may also be binary weighted. In that regard, suppose resistor $R_2$ for dual-mode leg 1 has one half the resistance of resistor $R_1$ for dual-mode leg 0 in pull-down section 305. If dual-mode leg 0 conducts a current I', then dual-mode leg 0 may be configured to conduct a current I'/2 such that the sum of I' and I'/2 equals the current I necessary to provide the desired output impedance. Such a binary weighting makes the dual-mode leg design relatively straightforward. For example, only the data path will be conducting in each dual-mode leg for the fastest expected process corner (the first mode of operation). To accommodate this fast process corner, data transistor M1 in dual-mode leg 0 may have a size sufficient to support current I' whereas data transistor M1 in dual-mode leg 1 may have a smaller size since it needs only to support current I'/2. At the slowest expected process corner, one can calculate the necessary size for the corresponding calibration transistor such that the combination of the data transistor and the calibration transistor can accommodate the desired current (the second mode of operation). For example, calibration transistor M2 in dual-mode leg 0 may be sized such that in combination with corresponding data transistor M1, dual-mode leg 0 will sink the desired current I' at the slow process corner.

Figure 4:
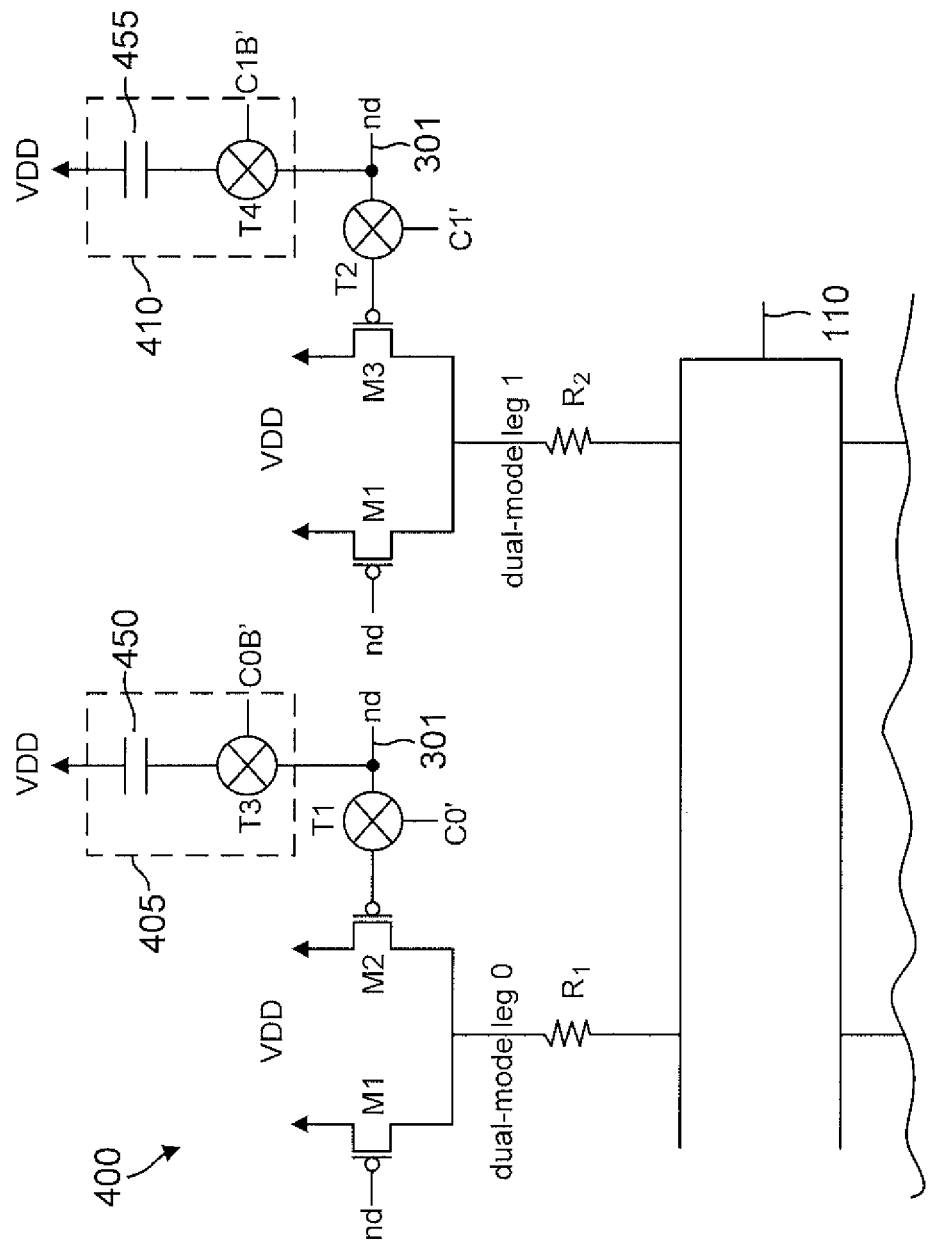
FIG. 4 is a schematic diagram of a pull-up section for the impedance-calibrated output driver of FIG. 3.

A pull-up section 400 for output driver 300 is shown in FIG. 4. Pull-up section 400 is analogous to pull-down section 305 in that it contains a dual-mode leg 0 as well as a dual-mode leg 1. These legs are analogous to the corresponding legs in pull-down section 305 except that they couple between a power supply node and output node 110 and the calibration and data transistors are PMOS transistors instead of NMOS transistors. A first mode of operation for a dual-mode leg in pull-up section 400 corresponds to the assertion of the data output signal (and thus corresponds to a de-assertion of complement output data signal nd) without an assertion of the corresponding calibration bit. Similarly, a second mode of operation for a dual-mode leg in pull-up section corresponds to both the assertion of the data output signal and the corresponding calibration bit. Each dual-mode leg in pull-up section 400 includes a data path comprising a PMOS data transistor M1 that has its gate driven by complement data output signal nd. Thus, when complement data output signal nd is de-asserted low (corresponding to the data output signal being driven high to VDD), the data path in dual-mode leg 0 couples a power supply node supplying the power supply voltage VDD through a resistor $R_1$ to output node 110. The same de-assertion of complement data output signal nd couples the power supply node through a resistor $R_2$ in dual-mode leg 1 to output pad 110 responsive to its PMOS data transistor M1 switching on in response to the de-assertion of the complement data output signal nd.

Each dual-mode leg in pull-up section 400 also includes a calibration path comprising a calibration transistor. For example, dual-mode leg 0 includes a PMOS calibration transistor M2 having a gate that couples to complement data output signal nd through a first transmission gate T1 controlled by calibration bit C0'. A source for PMOS calibration transistor M2 couples to the power supply node whereas its drain couples to resistor $R_1$. Thus, when both calibration bit C0 is asserted and complement data output signal nd is de-asserted, calibration transistor M2 switches on to couple the power supply node through resistor $R_1$ to output pad 110. Similarly, dual-mode leg 1 includes a PMOS calibration transistor M3 having a gate that couples to complement data output signal nd through a first transmission gate T2 controlled by calibration bit C1'. The source of calibration transistor M3 couples to the power supply node whereas its drain couples to resistor $R_2$. Calibration bits C0' and C1' are independent of the calibration bits used for the corresponding pull-down section. In other words, the impedance calibration word comprising bits C0' and C1' is independent of the impedance calibration word for pull-down section 305. Pull-up section 400 also includes a plurality of selectable capacitors corresponding to its plurality of dual-mode legs. In particular, pull-up section 400 includes a selectable capacitor 405 corresponding to dual-mode leg 0 and a selectable capacitor 410 corresponding to dual-mode leg 1. As described analogously with regard to the operation of pull-down section 305, each selectable capacitor in pull-up section 400 capacitively loads data node 301 when its corresponding dual-mode leg's calibration bit is de-asserted and the data output signal is de-asserted. Selectable capacitor 405 includes a second transmission gate T3 coupled between data node 301 and a terminal for a capacitor 450. An opposing second terminal for capacitor 450 couples to the power supply node. Second transmission gate T3 switches on in response to an assertion of the complement of calibration bit C0' (C0B') so that capacitor 450 loads data node 301. Similarly, selectable capacitor 410 includes a second transmission gate T4 coupled between a terminal for a capacitor 455 and data node 301. An opposing second terminal for capacitor 455 couples to the power supply node. When second transmission gate T4 conducts in response to an assertion of the complement of calibration bit C1' (C1B'), capacitor 455 loads data node 301. In an alternative embodiment, capacitors 450 and 455 could couple to ground instead of the power supply node.

Depending upon the binary state of the data output signal (and thus also depending upon the binary state of the complement data output signal nd), either pull-up section 400 or pull-down section 305 is active. If the data output signal is high, then pull-up section 400 is active. Similarly, if the data output signal is low, then pull-down section 305 is active. The selectable capacitors in the active section respond to the assertion of their corresponding complement calibration bits to load data node 301. For example, dual-mode leg 0 in pull-up section 400 has a calibration path that conducts responsive to the assertion of a calibration bit C0'. If calibration bit C0' is not asserted, then its complement C0B' is asserted. The assertion of C0B' closes second transmission gate T3 in selectable capacitor 405 so that capacitor 450 loads data node 301. In one embodiment, the selectable capacitors comprise a means for adjusting a slew rate of the data output signal responsive to an output impedance calibration. In turn, the calibration paths comprise a means for calibrating an output impedance of the output pad.

As discussed above, each pull-up section and pull-down section includes a plurality of calibration paths configured to respond to a calibration word comprising a plurality of calibration bits. The calibration word for a pull-up section in an output driver may be independent to the calibration word for the output driver's pull-down section. A calibration path is denoted herein as being "selected" when it conducts responsive to an assertion of the corresponding calibration bit. The plurality of calibration paths for each pull-down section and pull-up section may be implemented through a corresponding plurality of calibration transistors. With regard to the calibration paths/transistors, the transmission gates in each pull-up section and pull-down section may be divided into two pluralities: a plurality of first transmission gates and a plurality of second transmission gates. The plurality of first transmission gates correspond to the plurality of calibration paths (or equivalently, to the plurality of calibration transistors). For example, in pull-down sections 205 and 305, gates T1 and T2 are first transmission gates. Transmission gate T1 in pull-down section 205 corresponds to calibration transistor M2 whereas transmission gate T2 corresponds to calibration transistor M3. Each first transmission gate is configured to couple the complement data output signal nd to a gate of the corresponding calibration transistor responsive to an assertion of the corresponding calibration bit. Thus, first transmission gate T2 in output driver 200 couples the complement data output signal nd to the gate of calibration transistor M3 responsive to an assertion of calibration bit C1.

Each pull-up section and pull-down section includes a corresponding plurality of selectable capacitors. Each section's plurality of selectable capacitors corresponds to the section's plurality of calibration paths/transistors. Each selectable capacitor comprises a second transmission gate and a corresponding capacitor. Each second transmission gate is configured to couple its corresponding capacitor to a node carrying the complement data output signal nd responsive to an assertion of the complement of the corresponding calibration bit. For instance, gate T3 in pull-up section 400 couples capacitor 450 to data node 301 carrying the complement data output signal nd responsive to an assertion of the complement of calibration bit C0' (C0B')—in other words, responsive to the non-assertion of the corresponding calibration bit.

An example method of slew rate control for an impedance-calibrated output driver will now be discussed.

Example Method of Use

Figure 5:
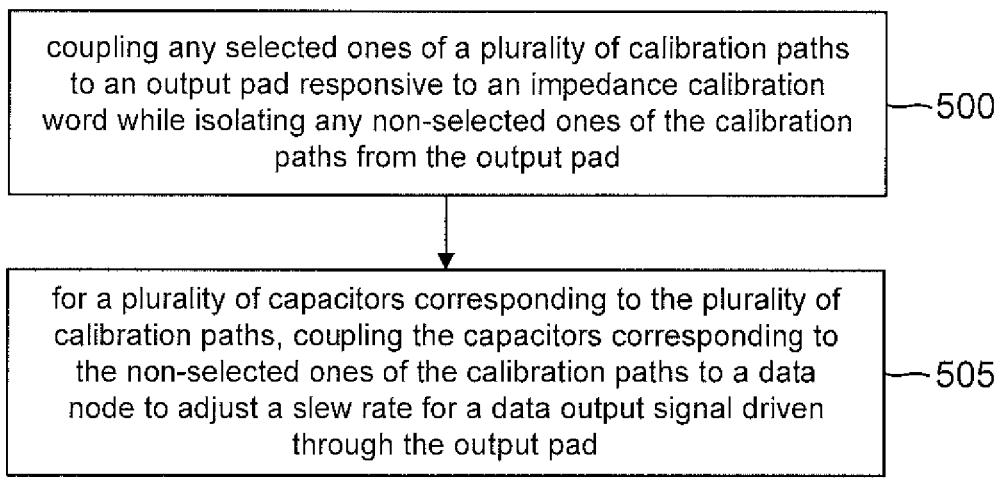
FIG. 5 is a flowchart for an example method of use for an impedance-calibrated driver with slew rate control in accordance with an embodiment of the disclosure.

A flowchart for an example method of slew rate control for an impedance-calibrated output driver with is shown in FIG. 5. This method of use is generic to the architectures discussed herein. Thus the flowchart is independent of whether selectable legs or dual-mode legs are used in the corresponding impedance-calibrated output driver's pull-up and pull-down sections. The impedance-calibrated output driver merely needs to include calibration paths. The method includes a step 500 of coupling any selected ones of a plurality of calibration paths to an output pad responsive to an impedance calibration word while isolating any non-selected ones of the calibration paths from the output pad. In this fashion, a desired output impedance is provided for a data output signal driven through the output pad. For a plurality of capacitors corresponding to the plurality of calibration paths, a step 505 comprises coupling the capacitors corresponding to the non-selected ones of the calibration paths to a data node to adjust a slew rate for a data output signal driven though the output pad.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A driver for driving a data output signal through an output pad, comprising:
a pull-down section including a plurality of first dual-mode legs coupled in parallel between an output node and ground, wherein the pull-down section is configured to receive a first calibration word having a plurality of first calibration bits corresponding to the plurality of first dual-mode legs, and wherein each first dual-mode leg includes:
a first resistor having a first terminal coupled to the output node;
a first data transistor coupled between a second terminal for the first resistor and ground, the first data transistor configured to conduct responsive to an assertion of a complement data signal carried on a complement data node; and
a first calibration transistor coupled between the second terminal and ground, the first calibration transistor configured to conduct responsive to an assertion of both the first dual-mode leg's corresponding first calibration bit and an assertion of the complement data signal; and
wherein the pull-down section further includes:
a plurality of first selectable capacitors corresponding to the plurality of first calibration bits, each first selectable capacitor being configured to capacitively load the complement data node responsive to the first selectable capacitor's corresponding calibration bit being de-asserted.

2. The driver of claim 1, further comprising a pull-up section including a plurality of second dual-mode legs coupled in parallel between the output node and a power supply node, wherein the pull-up section is configured to receive a second calibration word having a plurality of second calibration bits corresponding to the plurality of second dual-mode legs, and wherein each second dual-mode leg includes:
a second resistor having a first terminal coupled to the output node;
a second data transistor coupled between a second terminal for the second resistor and the power supply node, the second data transistor configured to conduct responsive to an assertion of a data signal carried on a data node, wherein the complement data signal is a complement of the data signal; and
a second calibration transistor coupled between the second terminal for the second resistor and the power supply node, the second calibration transistor configured to conduct responsive to an assertion of both the second dual-mode leg's corresponding second calibration bit and an assertion of the data signal; and wherein the pull-up section further includes:
a plurality of second selectable capacitors corresponding to the plurality of second calibration bits, each second selectable capacitor being configured to capacitively load the data node responsive to the second selectable capacitor's corresponding second calibration bit being de-asserted.

3. The driver of claim 1, wherein the pull-down section further comprises a plurality of first transmission gates corresponding to the plurality of first calibration transistors, each first transmission gate being configured to couple the complement data node to a gate of the corresponding first calibration transistor responsive to an assertion of the corresponding first calibration bit.

4. The driver of claim 3, wherein each first selectable capacitor comprises a second transmission gate and a corresponding capacitor, each second transmission gate being configured to couple the data node to the corresponding capacitor responsive to an assertion of a complement of the corresponding first calibration bit.

5. A method, comprising:
for a pull-down section including a plurality of dual-mode legs coupled in parallel between an output node and ground, wherein each dual-mode leg includes a resistor having a first terminal coupled to the output node, a data transistor coupled between a second terminal for the resistor and ground, and a calibration transistor coupled between the second terminal and ground, switching on each data transistor while a complement data signal is asserted;
calibrating an output impedance for the output node by switching on the calibration transistor in selected ones of the dual-mode legs while the complement data signal is asserted; and
for a plurality of capacitors corresponding to the plurality of calibration transistors, coupling the capacitors corresponding to non-conducting ones of the first calibration transistors to a complement data node carrying the complement data signal to adjust a slew rate for a data output signal produced at the output node.

6. The method of claim 5, wherein switching on the first calibration transistor in each of the selected ones of the first dual-mode legs comprises switching on a transmission gate to couple a gate of the first calibration transistor to the asserted complement data signal.

7. The method of claim 6, wherein coupling the capacitors corresponding to the non-conducting ones of the first calibration transistors to the complement data node comprises coupling the capacitors to the complement data node through second transmission gates.

* * * * *